United States Patent [19]

Ito et al.

[11] Patent Number: 5,298,785
[45] Date of Patent: Mar. 29, 1994

[54] SEMICONDUCTOR DEVICE

[75] Inventors: Shinichi Ito; Jiro Terashima, both of Kanagawa, Japan

[73] Assignee: Fuji Electric Co., Ltd., Kanagawa, Japan

[21] Appl. No.: 687,029

[22] Filed: Apr. 18, 1991

Related U.S. Application Data

[63] Continuation of Ser. No. 600,172, Oct. 19, 1990, Pat. No. 5,053,847, which is a continuation of Ser. No. 194,467, May 12, 1988, abandoned.

Foreign Application Priority Data

May 15, 1987 [JP] Japan .................. 62-118229
Aug. 6, 1998 [JP] Japan .................. 62-196926

[51] Int. Cl.⁵ .................................. H01L 29/72
[52] U.S. Cl. ..................... 257/538; 257/539; 257/581
[58] Field of Search ............ 357/36; 257/538, 539, 257/540, 541, 563, 581, 582

[56] References Cited

U.S. PATENT DOCUMENTS

| | | | |
|---|---|---|---|
| 4,001,762 | 1/1977 | Aoki et al. | 357/51 |
| 4,370,670 | 1/1983 | Nawata et al. | 357/36 |
| 4,500,900 | 2/1985 | Shimizu | 357/36 |
| 4,579,600 | 4/1986 | Shah et al. | 357/51 |
| 4,586,072 | 4/1986 | Nakatani et al. | 357/36 |
| 4,626,886 | 12/1986 | Tihanyi | 357/36 |
| 4,680,608 | 7/1987 | Tsuzuki et al. | 357/36 |
| 5,053,847 | 10/1991 | Ito et al. | 257/582 |

FOREIGN PATENT DOCUMENTS

| | | | |
|---|---|---|---|
| 2011431 | 2/1970 | France. | |
| 62-216266 | 9/1987 | Japan | 257/539 |
| 2089564 | 6/1982 | United Kingdom. | |
| 2101652 | 2/1983 | United Kingdom. | |

OTHER PUBLICATIONS

Patent Abstracts of Japan, vol. 11, No. 88, JP-A-61 242 071, Oct. 28, 1986.

Primary Examiner—Jerome Jackson
Assistant Examiner—Courtnay A. Bowers
Attorney, Agent, or Firm—Finnegan, Henderson Farabow, Garrett & Dunner

[57] ABSTRACT

A multi-emitter type semiconductor device having multiple transistors coupled in parallel which utilize a common substrate. Between a selected emitter electrode and a base contact, a stabilizing resistive region is formed in the common substrate. In order to reduce the parasitic effects due to this region an additional emitter ballast resistor may be formed on the surface of an insulating layer over the substrate. This supplemental resistor formed on the insulating layer is made from polycrystalline silicon. Alternatively, the supplemental resistor can be combined with the resistance of the stabilizing region in a single resistor located on the surface of the insulating layer.

3 Claims, 2 Drawing Sheets

SEMICONDUCTOR DEVICE

This is a continuation of application Ser. No. 07/600,172, filed Oct. 19, 1990, U.S. Pat. No. 5,053,847, which is a continuation of application Ser. No. 07/194,467, filed May 12, 1988, abandoned.

BACKGROUND OF THE INVENTION

1. Field of the Invention

The present invention generally relates to semiconductor devices, and particularly relates to a semiconductor device in which a plurality of transistor units are provided on a common substrate, an emitter ballast resistor is connected to the emitter of each transistor unit, and a stabilizing resistor is connected between the base and emitter of each transistor unit.

2. Description of the Prior Art

An example of a semiconductor device having multiple transistor units connected in parallel and formed in a common substrate is a semiconductor device having a structure generally called a mesh-or multi-emitter structure, as illustrated by an equivalent circuit in FIG. 1. A multi-emitter structure may include an emitter ballast resistor 8, for example, made of a polycrystalline silicon resistor connected between an emitter contact electrode 22 so as to expand the area of safe operation of each transistor unit. Additionally, a resistor 26 is connected between a common base electrode 25 and the common emitter electrode 23 for the sake of stabilization of the withstanding voltage between the collector and emitter of each transistor unit.

FIG. 2 is a sectional view of an example of such a semiconductor device. An N-type collector region 2, a P-type base region 3 and an N-type emitter region 4 are successively formed in a substrate 1, and then the substrate 1 is coated with an insulating film 5 of silicon dioxide, $SiO_2$. Base electrodes 6 of the respective transistor units are formed so as to contact the base region 3 through the holes of the insulating film 5.

Base electrodes 6 of the respective transistor units are connected in parallel to each other, and a base terminal B is led out from a bonding portion (not shown) of the connection. In FIG. 2, the parallel connection of the respective base electrodes 6 is shown by lines in the form of an equivalent circuit.

Emitter contact electrodes 7 of the respective transistor units are formed so as to contact with emitter region 4 through the holes of the insulating film 5. Emitter ballast resistors 8 of polycrystalline silicon film are formed on insulating film 5 so as to contact with the respective emitter contact electrodes 7.

Moreover, emitter electrodes 9 are provided on the insulating film 5 so as to connect with the respective emitter ballast resistor 8. Emitter electrodes 9 of the respective transistor units are connected in parallel to each other, and an emitter terminal E is led out from the bonding portion (not shown) of the connection. In FIG. 2 the parallel connection of the respective emitter electrodes 9 is shown by lines in the form of an equivalent circuit.

In base region 3, an elongated N-type region 41 of the same conductivity type as emitter region 4 is formed in the surface layer of base region 3, and insulating film 5 is removed to expose both ends 11 and 12 of region 41 so as to make contact with one base electrode 6 and one emitter electrode 9, respectively. Thus, the region 41 acts as a resistive region between base electrode 6 and emitter electrode 9, so that it is possible to ensure the stabilization of the withstanding voltage between the collector and the emitter of each transistor.

However, owing to the provision of the N-type resistive region 41, an NPN transistor structure is formed by the region 41, and the respective portions of base region 3 and collector region 2, which are located just under region 41. These parasitic transistor effects are weak in the region near end 11 contacting with base electrode 6 since an emitter current flows into the emitter through resistive region 41. The parasitic transistor effects are strong near end 12 of region 41 contacting emitter electrode 9 since this region acts as an emitter. Therefore, there has been a problem in that the transistor formed in the region near end 12 is not protected by the emitter ballast resistor so that the area of safe operation of the transistor becomes smallest and the device breaks down in this portion, making it impossible to obtain a desired area of safe operation for the semiconductor device.

SUMMARY OF THE INVENTION

It is therefore an object of the present invention to solve the problems in the prior art.

It is another object of the present invention to provide a semiconductor device, wherein breakdown of the resistive region connected between a base and an emitter is prevented and the area of safe operation expanded by adding emitter ballast resistors to the emitters is not reduced, and wherein the semiconductor device can be manufactured easily without an increase in the chip area.

It is a further object of the present invention to provide a semiconductor device in which a resistor is connected between a base and an emitter so that no parasitic transistor is formed and the area of safe operation expanded by adding emitter ballast resistors to the emitters is not reduced.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

In order to attain the above and other objects, according to an aspect of the present invention, the semiconductor device comprises a plurality of transistor units formed in one and the same substrate, an emitter ballast resistor being connected to an emitter of each the transistor units, a stabilizing resistive region having the same conductivity type as the emitter region, and another resistor being inserted between an emitter electrode and one end of the stabilizing resistive region connected to the emitter region. Preferably, the inserted resistor is formed simultaneously with the emitter ballast resistors by use of the same resistance material.

According to the present invention, emitter ballast resistors are added to respective emitters to expand the area of safe operation of respective transmitter units, a stabilizing resistive region is included in a substrate between a base and an emitter to stabilize the withstanding voltage of the semiconductor device, and a supplemental resistor for functioning as an emitter ballast resistor is formed so as to be added to the stabilizing resistive region simultaneously with the formation of the emitter ballast resistors so as to weaken the parasitic transistor operation of the stabilizing resistive region to prevent the reduction in the area of safe operation of the semiconductor device. Further, a stabilizing resistor to be connected between the base and the emitter may be alternatively formed on the substrate in the same manner as the emitter ballast resistors so that no parasitic transistor effects are generated to enable only the transistor units, each having the area of safe operation expanded by the function of the emitter ballast resistor, to operate in the resultant semiconductor device. Thus, it is possible to obtain a semiconductor device having an expanded region of safe operation.

To achieve the objects and in accordance with the purpose of the invention, as embodied and broadly described herein, the semiconductor device of this invention comprises a plurality of transistor units each including an emitter contact, a base contact, and a collector contact formed in a common substrate, a plurality of emitter ballast resistors each coupled to a corresponding emitter contact of each of the plurality of transistor units, a stabilizing resistive region located in the substrate between a selected base contact and a lead-out electrode, the stabilizing resistive region having the same conductivity type as the selected emitter region, an emitter electrode coupled to the corresponding emitter contact through the respective emitter ballast resistor, and a supplemental resistor located between a selected emitter electrode and the lead-out electrode for coupling the selected emitter electrode to the lead-out electrode and for reducing parasitic transistor effects in the stabilizing resistive region.

In another aspect of the invention, the semiconductor device comprises a plurality of transistor units each including an emitter contact, a base contact, and a collector contact formed in a common substrate, a plurality of emitter ballast resistors, each is coupled to a corresponding emitter contact of each of the plurality of transistor units, an emitter electrode is coupled to the corresponding emitter contact through the respective emitter ballast resistor, and a stabilizing resistor is located between a selected emitter electrode and a selected base contact, the emitter ballast resistor and the stabilizing resistor are formed from the same material.

The accompanying drawings, which are incorporated in and constitute a part of this specification, illustrate an embodiment of the invention and, together with the description, serve to explain the principles of the invention.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENTS

Embodiments of the semiconductor device according to the present invention will be described with reference to the drawings.

Figure 1:
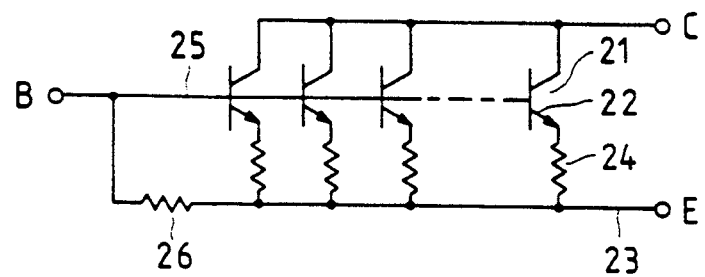
FIG. 1 is an equivalent circuit of a conventional semiconductor device.
Figure 2:
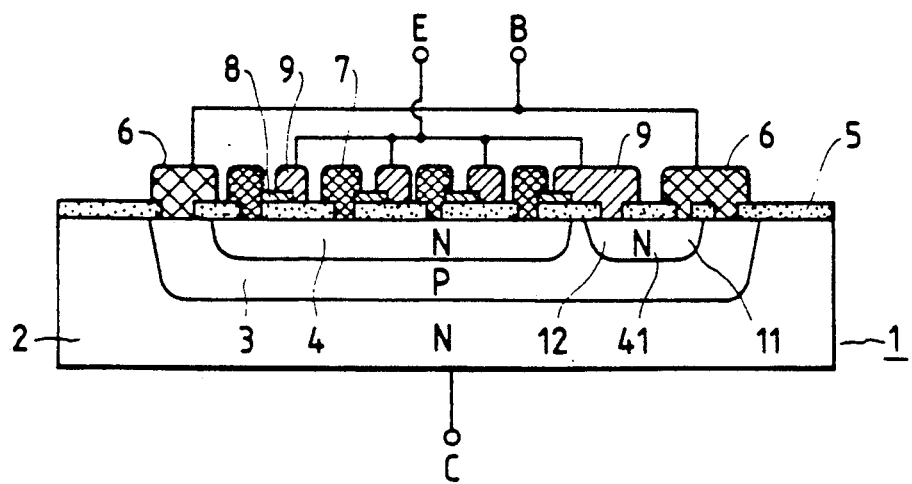
FIG. 2 is a cross-sectional view of a conventional semiconductor device.
Figure 3:
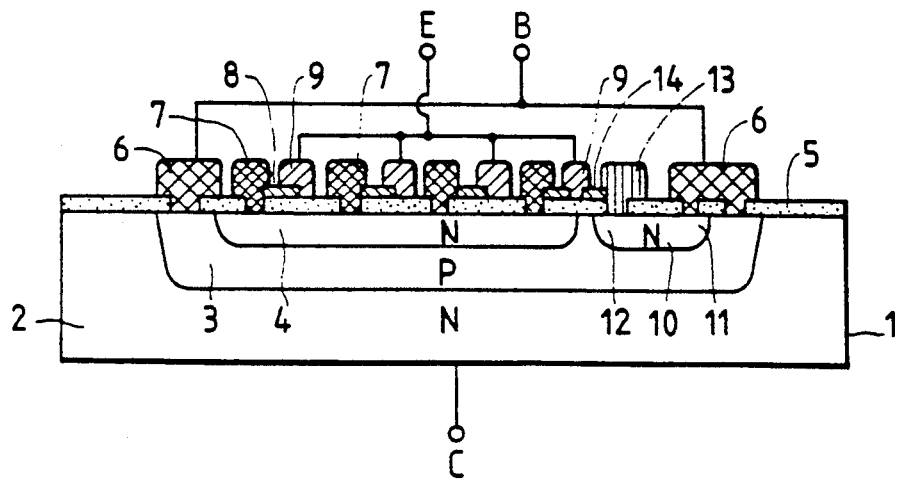
FIG. 3 is a cross-sectional view of an embodiment of the semiconductor device according to the present invention.
Figure 4:
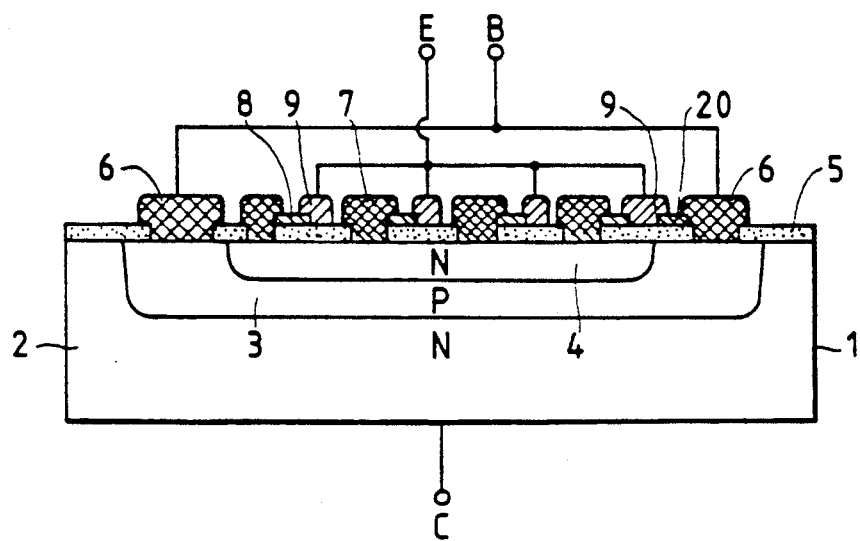
FIG. 4 is a cross-sectional view of another embodiment of the semiconductor device according to the present invention.

FIG. 3 shows a cross-sectional view of an embodiment of the semiconductor device according to the present invention where like reference numerals refer to like parts in FIGS. 2, 3 and 4. An N-type collector region 2, a P-type base region 3 and an N-type emitter region 4 are successively formed in a substrate 1, and then the substrate 1 is covered with an insulating film 5. Base electrodes 6 are formed so as to contact with the base region 3 through the holes of the insulating film 5. The base electrodes 6 of the respective transistor units are connected in parallel to each other, and a base terminal B is led out from the common connection.

Emitter contact electrodes 7 are formed so as to contact with emitter region 4 through the holes of insulating film 5. Emitter ballast resistors 8 each made of a polycrystalline silicon film are provided on insulating film 5 so as to contact with emitter contact electrodes 7, and emitter electrodes 9 are provided on insulating film 5 so as to contact with the respective emitter ballast resistors 8. Emitter electrodes 9 of the respective transistor units are connected in parallel to each other, and an emitter terminal E is led out from the common connection.

An elongated N-type stabilizing resistive region 10 of the same conductive type as emitter region 4 is formed in the surface of the base region 3. Insulating film 5 is removed to expose both ends 11 and 12 of stabilizing resistive region 10 so as to get respective contacts of base electrode 6 with end 11 of region 10 and a lead-out electrode 13 with end 12 of region 10. Lead-out electrode 13 also contacts with a supplemental resistor 14 formed on insulating film 5. Thus, a stabilizing resistor made of the N-type stabilizing resistive region 10 and the supplemental resistor 14 are inserted between a base and an emitter.

Supplemental resistor 14 may be formed simultaneously with the emitter ballast resistor 8 by using the same material.

Preferably, the resistance value of the emitter ballast resistor 8 is selected to be about 10 ohms, the resistance value of the N-type stabilizing resistive region 10 is selected to be about 100 ohms, and the resistance value of the supplemental resistor 14 is selected to be greater than or equal to that of emitter ballast resistor 8.

FIG. 4 shows a cross-sectional view of another embodiment of the semiconductor device according to the present invention. An N-type collector region 2, a P-type base region 3, and an N-type emitter region 4 are successively formed in a substrate 1, and then substrate 1 is covered with an insulating film 5. Base electrodes 6 are formed so as to contact with the base region 3 through the holes of the insulating film 5. The respective base electrodes 6 of the transistor units are connected in parallel to each other, and a base terminal B is lead out from the common connection. Emitter contact electrodes 7 are formed so as to contact with emitter region 4 through the holes of the insulating film 5. Emitter ballast resistors 8 of polycrystalline silicon film are provided on insulating film 5 so as to contact with the respective emitter contact electrodes 7, and emitter electrodes 9 are provided on insulating film 5 so as to contact with the respective emitter ballast resistors 8. Emitter electrodes 9 of the respective transistor units are connected in parallel to each other, and an emitter terminal E is lead out from the common connection.

Further, a stabilizing resistor 20 of polycrystalline silicon film is formed on the insulating film 5 between a base electrode 6 and an emitter electrode 9 so as to contact with the base electrode 6 and the emitter electrode 9. Stabilizing resistor 20 functions as a base-to-emitter stabilizing resistor. Since the stabilizing resistor 20 may be formed simultaneously with the emitter ballast resistor 8, execution of an additional step is not necessary. Although the resistance value of the ballast resistor 8 is established to be about 10 ohms, base-to-emitter stabilizing resistor 20 can be designed to have a resistance value within a range of up to several hundred ohms by suitably selecting its length and width.

As has been described above, according to the present invention, a resistor is further inserted between a stabilizing resistive region embedded in a substrate and an emitter. The added resistor acts as an emitter ballast resistor which weakens a parasitic transistor function generated in the stabilizing resistive region between an emitter and a base, thereby making it possible to expand the area of safe operation of the semiconductor device and to prevent the semiconductor device from breaking down. The resistor can be formed simultaneously with the emitter ballast resistor by using the same material, without complicating the manufacturing process.

Further, according to the present invention, a stabilizing resistive region located between a base contact and an emitter electrode is formed by a resistive layer on a substrate, so that it is not necessary to form a stabilizing resistive region in the substrate and a parasitic transistor having a small area of safe operation is not formed in each transistor unit in parallel. Accordingly, the area of safe operation of the semiconductor device is not reduced. Moreover, the stabilizing resistive region can be formed simultaneously with emitter ballast resistors by using the same material and the same process, without complicating the manufacturing process.

What is claimed is:

1. A semiconductor device, comprising:

a plurality of bipolar transistors connected in parallel and formed in a common substrate, an insulating film on the substrate, said plurality of bipolar transistors having a collector region in the substrate, a collector electrode coupled to the collector region, a base region in the collector region and at least one base contact electrode contacting the base region through an opening in the insulating film, each of said bipolar transistors including an emitter region in the base region, an emitter contact electrode contacting a respective emitter region through an opening in the insulating film, and an emitter electrode,;

a plurality of emitter ballast resistors of a deposition layer on the insulating film each coupled between a corresponding emitter contact electrode and a corresponding emitter electrode of each of the plurality of bipolar transistors; and a stabilizing resistor on the insulating film and located between an emitter electrode of a selected one of the plurality of bipolar transistors and the base electrode for reducing parasitic transistor effects in said semiconductor device, said emitter ballast resistors and said stabilizing resistor being of essentially the same material composition and of said deposition layer.

2. The semiconductor device according to claim 1, wherein said deposition layer comprises a polycrystalline silicon film.

3. The semiconductor device according to claim 1, wherein said stabilizing resistor has a resistance value within a range of up to several hundred ohms.

* * * * *